US012571836B2

(12) United States Patent
Ju et al.

(10) Patent No.: US 12,571,836 B2
(45) Date of Patent: Mar. 10, 2026

(54) TESTER AND TEST CONTROL DEVICE AND METHOD

(71) Applicant: BEIJING HUAFENG TEST & CONTROL TECHNOLOGY CO., LTD., Beijing (CN)

(72) Inventors: Ning Ju, Beijing (CN); Xiaotong Zhang, Beijing (CN)

(73) Assignee: BEIJING HUAFENG TEST & CONTROL TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 19/107,353

(22) PCT Filed: Sep. 27, 2023

(86) PCT No.: PCT/CN2023/122211
§ 371 (c)(1),
(2) Date: Feb. 27, 2025

(87) PCT Pub. No.: WO2024/067742
PCT Pub. Date: Apr. 4, 2024

(65) Prior Publication Data
US 2026/0002977 A1     Jan. 1, 2026

(30) Foreign Application Priority Data
Sep. 29, 2022    (CN) .......................... 202211198404.7

(51) Int. Cl.
*G01R 31/28*         (2006.01)
(52) U.S. Cl.
CPC ................................ *G01R 31/2834* (2013.01)

(58) Field of Classification Search
None
See application file for complete search history.

(56) References Cited

U.S. PATENT DOCUMENTS 7,042,243 B2 *  5/2006  Matsumoto ........ G01R 31/2851
                                                    324/762.01
7,171,598 B2 *  1/2007  Cullen ............. G11C 29/56004
                                                    714/724

(Continued)

FOREIGN PATENT DOCUMENTS

CN          1574268 A       2/2005
CN        103890597 A       6/2014
(Continued)

*Primary Examiner* — Jermele M Hollington
(74) *Attorney, Agent, or Firm* — John A. Miller; Shumaker, Loop & Kendrick, LLP

(57)                 ABSTRACT

The disclosure relates to a tester, a test control device and a test control method. The device comprises a parallel control unit and a plurality of station control units, wherein each of the station control units corresponds to at least one device under test. The parallel control unit is connected with the station control units and a host respectively and is configured to receive test items sent by the host and send each of test sequences in the test items to a station control unit corresponding to a device under test corresponding to the test sequence. Each of the station control units is connected with a plurality of function boards respectively, wherein functions realized by the function boards are different. Any station control unit is configured to send received test sequence(s) to corresponding function boards according to functions required to realize for the received test sequence(s).

11 Claims, 5 Drawing Sheets

(56)          References Cited

U.S. PATENT DOCUMENTS

| | | | | |
|---|---|---|---|---|
| 10,241,146 B2 * | 3/2019 | Su | ..................... | G01R 31/2803 |
| 2004/0239359 A1 * | 12/2004 | Matsumoto | ...... | G01R 31/31926 |
| | | | | 324/762.01 |
| 2010/0042878 A1 | 2/2010 | Kanasugi | | |
| 2010/0164527 A1 * | 7/2010 | Weyh | .............. | G01R 31/31907 |
| | | | | 324/750.3 |
| 2012/0198292 A1 | 8/2012 | Yuzurihara et al. | | |
| 2016/0245864 A1 * | 8/2016 | Mydill | ............. | G01R 31/31908 |

FOREIGN PATENT DOCUMENTS

| | | | | | |
|---|---|---|---|---|---|
| CN | 104678986 A | 6/2015 | | | |
| CN | 108845902 A | 11/2018 | | | |
| CN | 109959859 A | 7/2019 | | | |
| CN | 112306764 A | 2/2021 | | | |
| CN | 113514759 A | 10/2021 | | | |
| CN | 114217209 A | 3/2022 | | | |
| CN | 114705970 A | 7/2022 | | | |
| CN | 115453326 A | 12/2022 | | | |
| EP | 4597129 A1 * | 8/2025 | ......... | G01R 31/2834 |
| TW | 201837490 A | 10/2018 | | | |
| TW | 202223424 A | 6/2022 | | | |
| WO | 2018061326 A | 4/2018 | | | |

* cited by examiner

_◞ S701_ parallel control unit receives test items sent by the host, and sends each of test sequences in the test items to a station control unit corresponding to a device under test corresponding to the test sequence

_◞ S702_ any station control unit of the station control units sends received test sequence(s) to corresponding function boards according to functions required to realize for the received test sequence(s), so as to test device(s) under test corresponding to the received test sequence(s)

_◞ S703_ when the testing of a target device under test fails, the any station control unit controls the plurality of function boards to stop testing the target device under test, wherein the target device under test is the device under test corresponding to the any station control unit.

FIG.7

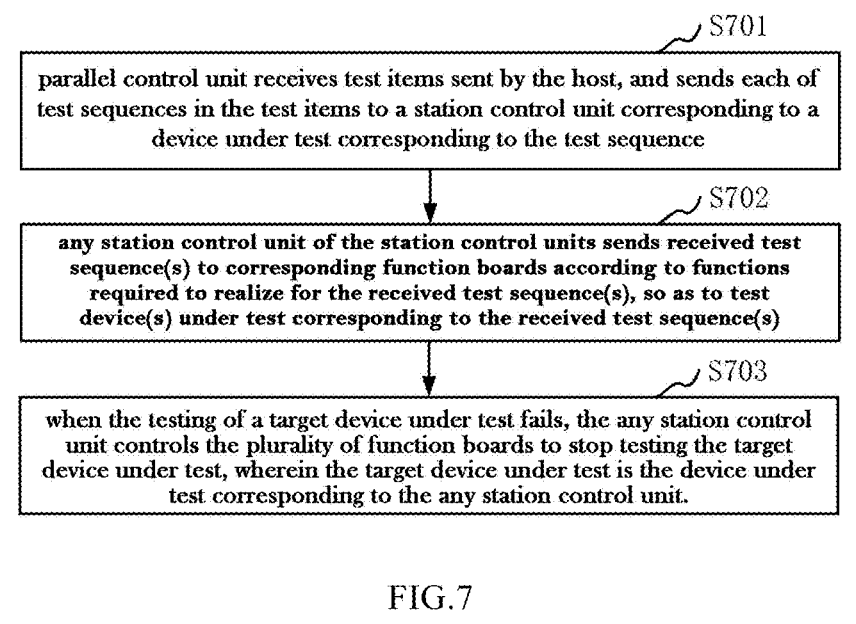

TESTER AND TEST CONTROL DEVICE AND METHOD

CROSS-REFERENCE TO RELATED APPLICATIONS

This application is a National Stage application of International Application No. PCT/CN2023/122211 filed Sep. 27, 2023, which claims priority to Chinese Patent application No. 202211198404.7, named "TESTER AND TEST CONTROL DEVICE AND METHOD" and filed with the China National Intellectual Property Administration on Sep. 29, 2022, the entire content of which is incorporated herein by reference.

BACKGROUND

Field

The present disclosure relates to the field of testing technology, and in particular to a tester, a testing control device and a testing control method.

Discussion of the Related Art

An automatic test equipment (ATE) is an equipment for detecting the functional completeness of an integrated circuit (IC) in the semiconductor industry, and is applied to the final process of the production and manufacturing of the integrated circuit to ensure the quality of the production and manufacturing of the integrated circuit.

The ATE includes a host, a tester and devices under test (DUT). A test sequence is sent to the tester by the host. Excitation signals are generated according to the test sequence and sent to the devices under test by the tester. Response signals are fed back to the tester by the devices under test according to the excitation signals. Test data is obtained according to the response signals and sent to the host by the tester. The test data is processed to obtain a test result by the host for instructing a manipulator (handler) to classify the devices under test.

As the number of devices under test increases, the testing of a single device under test, however, cannot be stopped separately in time when a test failure occurs in the device under test.

SUMMARY

In view of the problem in the prior art, there is a need to provide a tester, a test control device, and a test control method capable of separately stopping testing of a certain device under test.

A first aspect of the present disclosure provides a test control device. The device comprises a parallel control unit and a plurality of station control units, wherein each of the station control units corresponds to at least one device under test.

The parallel control unit is connected with the station control units and a host respectively and is configured to receive test items sent by the host and send each of test sequences in the test items to a station control unit corresponding to a device under test corresponding to the test sequence.

Each of the station control units is connected with a plurality of function boards respectively, wherein functions realized by the function boards are different. Any station control unit of the station control units is configured to: send received test sequence(s) to corresponding function boards according to functions required to realize for the received test sequence(s) so as to test device(s) under test corresponding to the received test sequence(s); and control the plurality of function boards to stop testing a target device under test when the testing of the target device under test fails, wherein the target device under test is a device under test corresponding to the any station control unit.

In one embodiment, the any station control unit is configured to: receive test failure information of the target device under test; determine a target number according to the test failure information, wherein the target number is a number of channels between the target device under test and the function boards; and send a shutdown instruction carrying the target number to at least one function board to control the at least one function board to disconnect the channels corresponding to the target number.

In one embodiment, the test failure information is test data obtained by the function boards performing a test on the target device under test, or a test result obtained by a co-processing module processing the test data.

In one embodiment, the any station control unit is configured to send the shutdown instruction to each of function boards, or send the shutdown instruction to a target function board, so that the target function board forwards the shutdown instruction to other function boards, wherein the target function board is any one of the plurality of function boards.

In one embodiment, the any station control unit is further configured to send a start instruction to each of the function boards after the testing corresponding to the test items is completed, so as to control the function boards to resume the channels corresponding to the target number.

In one embodiment, the parallel control unit is configured to: receive a test configuration sent by the host, wherein the test configuration includes channel numbers corresponding to the test sequences, and channels to which the channel numbers belongs are located between the function boards and the devices under test; and distribute each of the test sequences in the test item and a channel number corresponding to the test sequence in the test configuration to a station control unit corresponding to the channel number, and each of the station control units is configured to send received test sequence(s) and channel number(s) corresponding to the received test sequence(s) to function boards corresponding to the channel number(s).

In one embodiment, the device further comprises a packing unit connected between the station control units and the function boards in series and configured to pack test sequences sent by at least two station control units to the same function board and the channel numbers corresponding to the test sequences, and send them to the same function board.

In one embodiment, the device further comprises a synchronizing unit connected with the packing unit, the parallel control unit and the station control units respectively, and configured to acquire a synchronizing signal from the parallel control unit and send the synchronizing signal to the station control units and the packing unit.

In one embodiment, each of the station control units is further configured to stop sending test sequence(s) for the target device under test to the plurality of function boards when the testing of the target device under test fails.

A second aspect of the present disclosure provides a tester. The tester comprises the test control devices provided in the first aspect and a plurality of function boards.

In one embodiment, each of the function boards comprises a controller and a functional circuit, wherein the controller is configured to: receive a shutdown instruction carrying a target number, wherein the target number is a number of a channel between the target device under test and the function board; and control the functional circuit to stop sending excitation signal to the channel corresponding to the target number.

A third aspect of the present disclosure provides a test control method for applying to the test control device provided in the first aspect. The method comprises the following steps: receiving, by the parallel control unit, test items sent by the host and sending each of test sequences in the test items to a station control units corresponding to a device under test corresponding to the test sequence; sending, by any station control unit of the station control units, received test sequence(s) to corresponding function boards according to functions required to realize for the received test sequence(s), so as to test the device(s) under test corresponding to the received test sequence(s); controlling, by the any station control unit, the plurality of function boards to stop testing a target device under test when the testing of the target device under test fails, wherein the target device under test is a device under test corresponding to the any station control unit.

For the above tester, test control device and test control method, the test control device comprises a parallel control unit and a plurality of station control units, wherein each station control unit corresponds to at least one device under test. The parallel control unit is connected with the station control units and a host respectively and is configured to receive test items sent by the host and send each of test sequences in the test items to a station control unit corresponding to a device under test corresponding to the test sequence. Each of the station control units is connected with a plurality of function boards, wherein functions realized by the function boards are different. Any station control unit of the station control units is configured to send received test sequence(s) to corresponding function boards according to functions required to realize for the received test sequence(s) so as to test the device(s) under test corresponding to the received test sequence(s). When the testing of a device under test corresponding to the any station control unit fails, the plurality of function boards is controlled to stop testing a device under test corresponding to the any station control unit. The testing of the devices under test can be separately controlled by specially provided the station control units corresponding to the device under test. In this way, when the testing of a certain device under test fails, the station control unit corresponding to this device under test can control the function boards to stop testing this device under test, thereby avoiding waste of test resources. In addition, the tester comprises the test control device, and the test control method is applied to the test control device, so that the tester and the test control method can also separately stop the testing of a certain device under test, thereby avoiding the waste of testing resources.

BRIEF DESCRIPTION OF THE DRAWINGS

The drawings used in the description of the embodiments or the prior art will be briefly introduced for the purpose of illustrating the embodiments of the present disclosure or the technical solutions in the prior art in a clear manner. It should be appreciated that the drawings in the description merely illustrate some embodiments of the present disclosure. Other drawings may be obtained according to the drawings without creative efforts for those skilled in the art.

FIG. 7 is a flow diagram of a test control method according to an embodiment.

DESCRIPTION OF THE REFERENCE SIGNS

10 parallel control unit; 20 station control unit; 30 packing unit; 40 synchronizing unit; 100 device under test (DUT); 200 function board; 210 controller; 220 functional circuit; 300 co-processing module; 400 test control device; 500 host.

DETAILED DESCRIPTION OF THE EMBODIMENTS

In order to facilitate an understanding of the disclosure, the disclosure will be described in details hereinafter with reference to the accompanying drawings. Embodiments of the disclosure are shown in the accompanying drawings. This disclosure may, however, be implemented in many different forms and should not be construed as limited to the embodiments set forth herein. Rather, these embodiments are provided so that the disclosure may be thorough and comprehensive.

Unless defined otherwise, all technical and scientific terms used herein have the same meaning as commonly understood by those skilled in the art to which this disclosure belongs. The terms used in the description of the disclosure herein is for the purpose of describing particular embodiments only and is not intended to be limiting of the disclosure.

It should be appreciated that, as used herein, the terms "first," "second," and the like may be used to describe various elements, but these elements should not be limited by these terms. These terms are merely used to distinguish one element from another. For example, a first resistance may be referred to as a second resistance, and similarly, a second resistance may be referred to as a first resistance, without departing from the scope of the present disclosure. The first resistance and the second resistance are both resistances, but they are not the same resistance.

It should be appreciated that, "connection" in the following embodiments is to be understood as "electrical connection", "communication connection", and the like if the connected circuits, modules, units, and the like have communication of electrical signals or data with each other.

As used herein, the singular forms of the terms "a", "an" and "the" may include the plural forms as well, unless the context clearly indicates otherwise. It should be further appreciated that the terms "comprises/comprising", "having", and the like, specify the presence of defined features, integers, steps, operations, components, parts, or combinations thereof, but do not preclude the presence or addition of one or more other features, integers, steps, operations, components, parts, or combinations thereof. Also, as used in the disclosure, the term "and/or" includes any and all combinations of the associated listed items.

Figure 1:
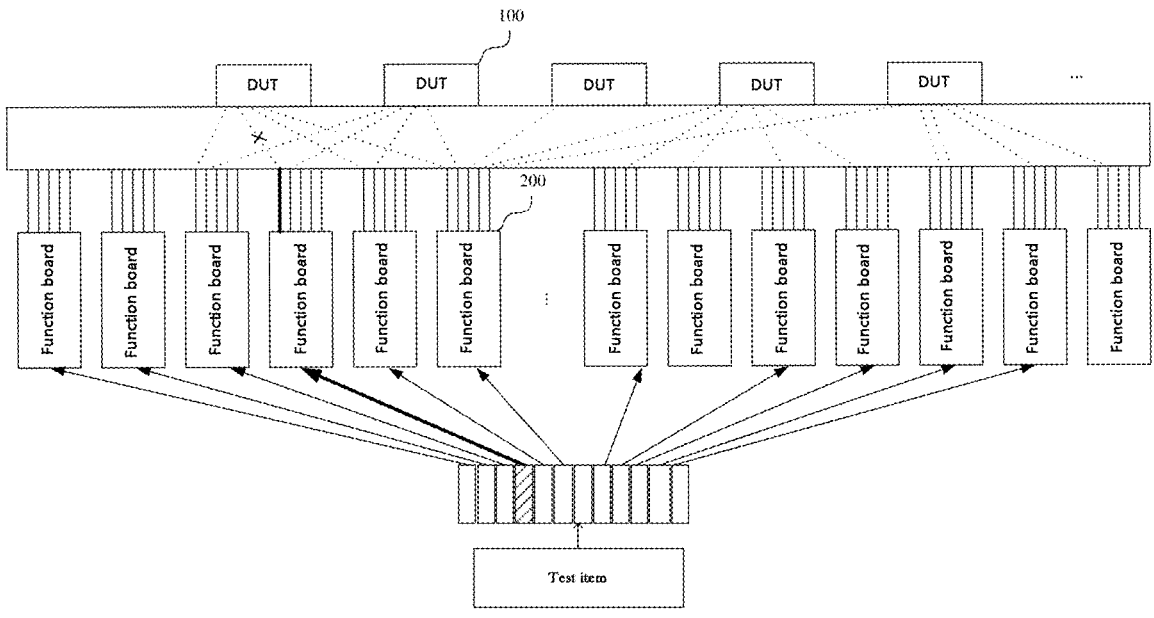
FIG. 1 is a diagram of an application scenario of a test control device according to an embodiment.

As described in the background, there is a problem in the prior art that testing of a single device under test cannot be stopped separately. According to the research of the inventor, the reason for this problem is in that, as shown in FIG. 1, testing of one device under test 100 is jointly realized by a plurality of function boards 200, while a plurality of devices under test 100 are tested by one function board 200. The connection relationship between the function boards 200 and the devices under test 100 is intricate. As the number of devices under test increases, it is difficult to achieve separate control over the testing of one device under test. Therefore, the testing of a single device under test cannot be stopped in time separately when a test failure occurs in the device under test.

Based on the above reasons, the present disclosure provides a tester, a test control device and a test control method, wherein station control units corresponding to the devices under test are specially provided, and each of test sequences in test items sent by a host to a parallel control unit is sent to function boards corresponding to the functions required to realize for the test sequence after passing a station control unit corresponding to a device under test corresponding to the test sequence, so that the devices under test corresponding to the test sequences are tested. In this way, the testing of each of the device under tests can be separately controlled by the corresponding station control unit, and when the testing of one device under test fails, the function boards can be controlled by the station control unit corresponding to the device under test to stop testing the device under test, so that the waste of testing resources can be avoided.

Figure 2:
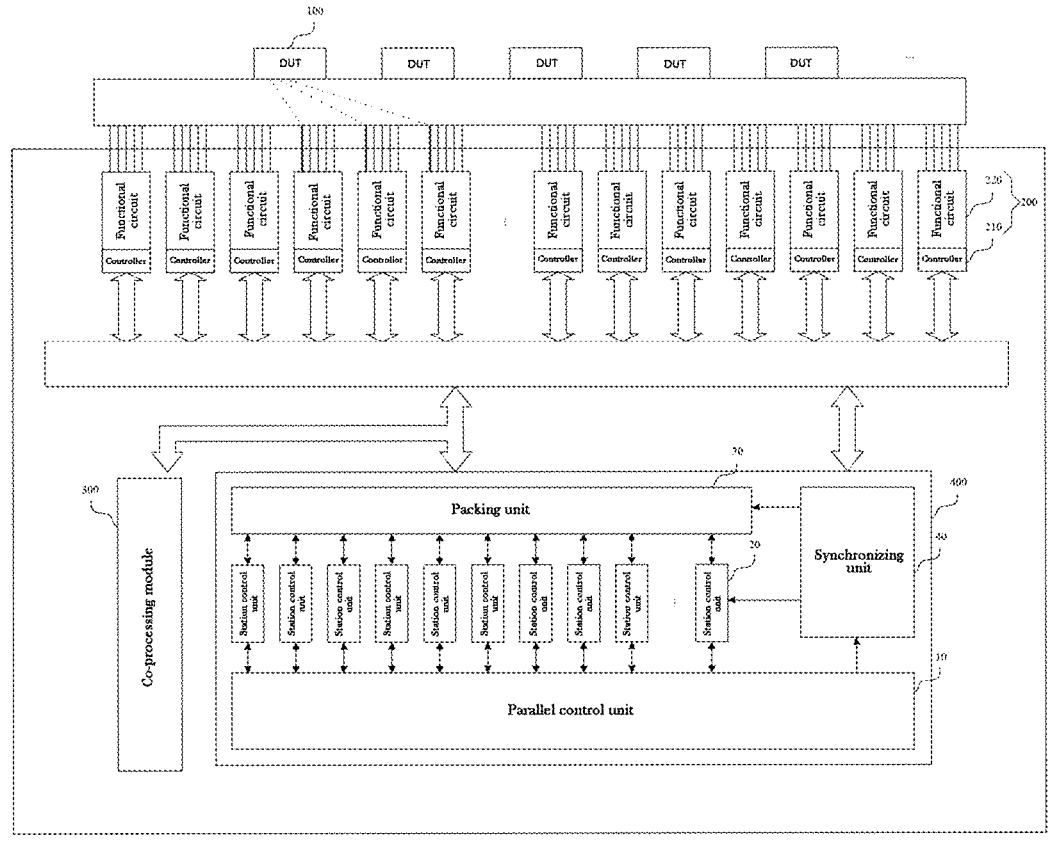
FIG. 2 is a schematic structure diagram of a test control device according to an embodiment.

In one embodiment, as shown in FIG. 2, a test control device comprising a parallel control unit 10 and a plurality of station control units 20 is provided. Each of the station control units 20 corresponds to at least one device under test 100. The parallel control unit 10 on one hand is connected with the station control units 20 and a host respectively, and is configured to receive test items sent by the host, and sending each of test sequences in the test items to a station control unit 20 corresponding to a device under test 100 corresponding to the test sequence.

Each of the station control units 20 is connected with a plurality of function boards 200, where functions realized by the function boards 200 are different. Any station control unit 20 of the station control units is configured to: send, according to functions required to realize for received test sequence(s), the received test sequence(s) to corresponding function boards 200, so as to test the device(s) under test 100 corresponding to the received test sequence(s); and control the function boards 200 to stop testing a target device under test when the testing of the target device under test fails, wherein the target device under test is a device under test 100 corresponding to the any station control unit 20.

Wherein, the parallel control unit 10 and the station control units 20 are both processors. In practice, the parallel control unit 10 and the station control units 20 may be realized by the same processor, or may be realized by different processors. The number of processors implementing the parallel control unit 10 and the station control units 20 may be one or more.

Specifically, test items are sent to the parallel control unit 10 by the host. Each of test sequences in the test items is sent to a station control unit 20 corresponding to a device under test 100 corresponding to the test sequence by the parallel control unit 10. Received test sequence(s) is sent to corresponding function boards 200 by the station control unit 20 according to the functions required to realize for the received test sequence(s). An excitation signal is sent to device(s) under test 100 corresponding to the received test sequence(s) by the function boards 200 according to the received test sequence(s). A response signal is fed back by the device(s) under test 100 based on the received excitation signal. Test data is obtained by the function boards 200 according to the received response signal. If the test data needs to be processed, the test data is sent to the co-processing module 300 by the function boards 200. The test data is processed by the co-processing module 300 to obtain a test result. If the test data obtained by the function boards 200 or the test result obtained by the co-processing module 300 indicates that the testing of a certain device under test 100 fails, a plurality of function boards 200 are controlled by the station control unit 20 corresponding to this device under test 100 to stop testing this device under test 100. At this point, testing of other devices under test 100 other than this device under test 100 continues.

The test control device comprises the parallel control unit and the plurality of station control units, wherein each of the station control units corresponds to at least one device under test. The parallel control unit is respectively connected to the host and the station control units, receives the test items sent by the host, and sends each of test sequences in the test items to the station control unit corresponding to the device under test corresponding to the test sequence. Each of the station control units is respectively connected to the plurality of function boards, wherein the functions realized by the function boards are different. Any station control unit of the station control units is configured to send received test sequence(s) to corresponding function boards according to functions required to realize for the received test sequence(s), so as to test device(s) under test corresponding to the received test sequence(s). When the testing of a device under test corresponding to the any station control unit fails, the plurality of function boards is controlled to stop testing the device under test corresponding to the any station control unit. The testing of each of the devices under test can be separately controlled by specially providing the station control units corresponding to the devices under test. In this way, when the testing of a certain device under test fails, the station control unit corresponding to this device under test can control the function boards to stop testing this device under test, which can avoid waste of test resources.

The functions realized by the function boards are different, and it may be understood as including the following situations: the functions realized by the function boards are all different from each other; or, the functions realized by a part of the function boards are different from each other, and the functions realized by the other part of the function boards are the same; or, each of the function boards realizes a plurality of functions, some of which are the same.

In one embodiment, the any station control units 20 is configured to: receive test failure information of a target device under test; determine a target number according to the test failure information, wherein the target number is a number of channels between the target device under test and the function boards 200; and send a shutdown instruction carrying the target number to at least one function board 200 to control the at least one function board 200 to disconnect the channels corresponding to the target number.

Figure 3:
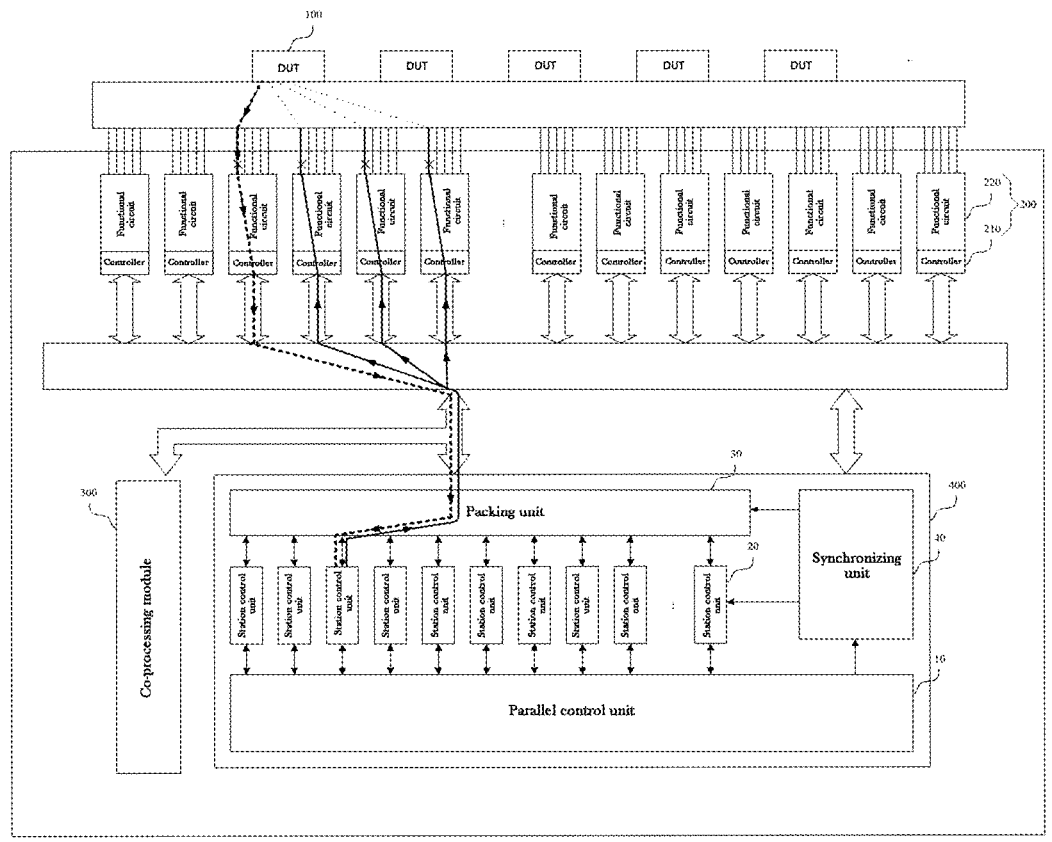
FIG. 3 is a schematic diagram illustrating information interaction between a test control device and function boards according to an embodiment.

FIG. 3 is a schematic diagram illustrating information interaction between a test control device and function boards. As shown in FIG. 3, in a direction from left to right, a test performed through an excitation signal sent by the third function board 200 to the first device under test 100 fails, and a test failure information is sent first from the first device under test 100 to the third function board 200 and then from the third function board 200 to the third station control unit 20 corresponding to the first device under test 100 (which is shown by a dash line in the figure). A shutdown instruction is sent by the third station control unit 20 to the plurality of function boards 200 (which is shown by a solid line), so as to control the disconnection of the channels connecting the function boards 200 to the first device under test 100.

In the above embodiment, by receiving the test failure information of the target device under test, it may be determined that the testing of the target device under test fails, and since the test failure information comes from the target device under test, the number of the channels between the target device under test and the function boards, i.e., the target number, may be determined according to the test failure information. By sending the shutdown instruction carrying the target number to the function boards, the function boards may disconnect the channels between the function boards and the target device under test according to the number of the channels between the function boards and the target device under test, thereby controlling the function boards to stop testing the target device under test.

In one embodiment, the test failure information is test data obtained by the function boards 200 performing a test on the target device under test.

As shown in FIG. 3, in a direction from left to right, a test performed through an excitation signal sent by the third function board 200 to the first device under test 100 fails, and a test failure information is sent first from the first device under test 100 to the third function board 200 and then from the third function board 200 to the third station control unit 20 corresponding to the first device under test 100 (which is shown by a dash line in the figure).

In one embodiment, the test failure information is a test result obtained by the co-processing module 300 processing the test data.

Figure 4:
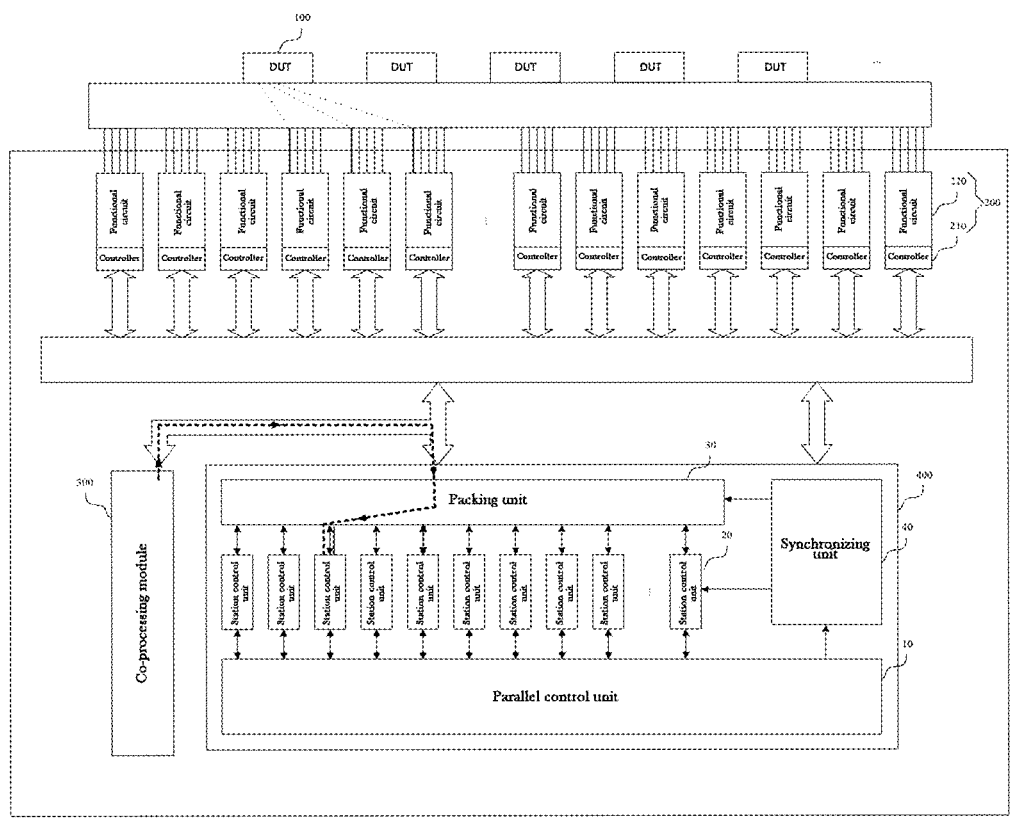
FIG. 4 is a schematic diagram illustrating internal information interaction of a test control device according to an embodiment.

FIG. 4 is a schematic diagram illustrating internal information interaction of a test control device. As shown in FIG. 4, in a direction from left to right, a test performed through an excitation signal sent by the third function board 200 to the first device under test 100 fails, a response signal is generated by the first device under test 100 based on the excitation signal and is sent to the third function board 200, test data is generated by the third function board 200 according to the response signal and is sent to the co-processing module 300, and a test result, i.e., test failure information, is obtained by the co-processing module 300 processing the test data. This test failure information is sent from the co-processing module 300 to the third station control unit 20 corresponding to the first device under test 100 (which is shown by a dashed line).

In one embodiment, the any station control unit 20 is configured to send a shutdown instruction to each of the function boards 200.

As shown in FIG. 3, in a direction from left to right, a test performed through an excitation signal sent by the third function board 200 to the first device under test 100 fails, and a test failure information is sent to the third station control unit 20 corresponding to the first device under test 100 (which is shown by a dash line in the figure). A shutdown instruction is sent by the third control unit 20 to each of the function boards 200 (which is shown by a solid line in the figure), so as to control the disconnection of the channels connecting the function boards 200 to the first device under test 100.

In another embodiment, the any station control unit 20 is configured to send a shutdown instruction to a target function board, so that the target function board forwards the shutdown instruction to other function boards, wherein the target function board is any function board 200 in the plurality of function boards 200.

Figure 5:
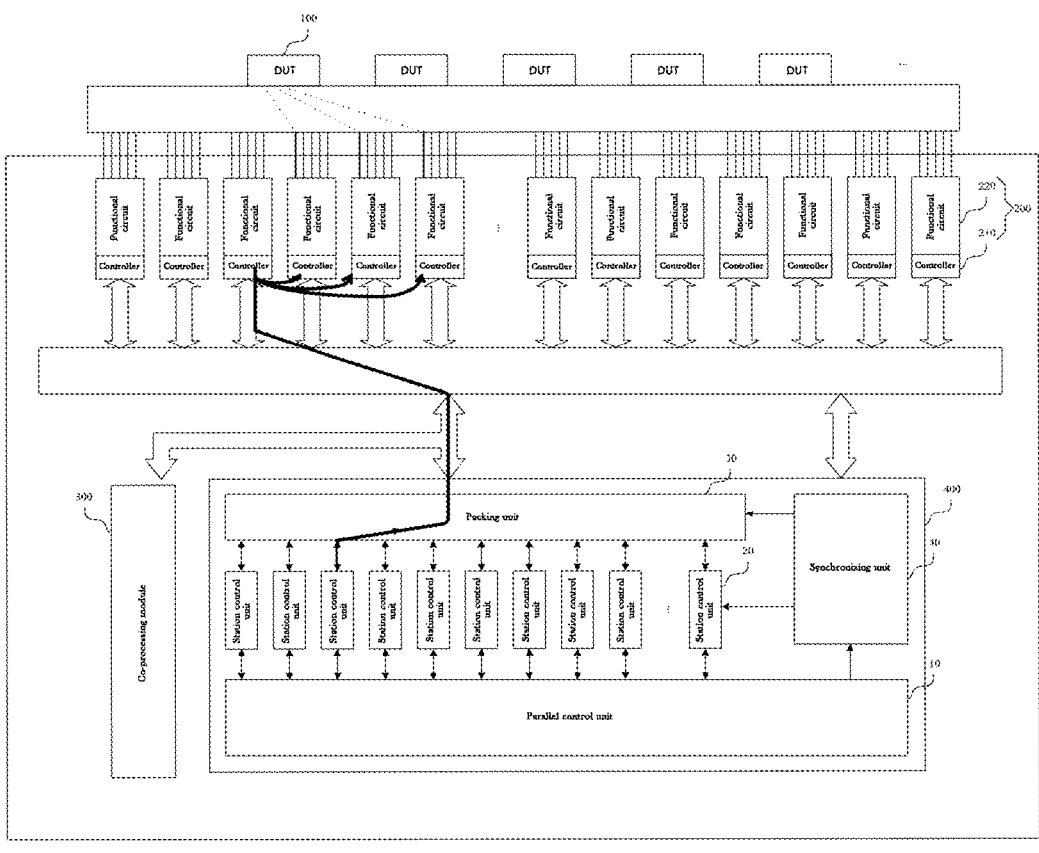
FIG. 5 is a schematic diagram illustrating information interaction between a test control device and function boards according to an embodiment.

FIG. 5 is a schematic diagram illustrating information interaction between a test control device and function boards. As shown in FIG. 5, in a direction from left to right, a test performed through an excitation signal sent by the third function board 200 to the first device under test 100 fails, and a test failure information is sent to the third station control unit 20 corresponding to the first device under test 100. A shutdown instruction is first sent by the third control unit 20 to the third function board 200, and then sent by the third function board 200 to the fourth function board 200, the fifth function board 200 and the sixth function board 200 (which is shown by a solid line in the figure), so as to control the disconnection of the channels connecting the function boards 200 to the first device under test 100.

In an embodiment, the any station control unit 20 is further configured to send, after the test corresponding to the test items is completed, an start instruction to the function boards 200, so as to control the function boards 200 to resume the channels corresponding to the target number.

In the above embodiment, after the test corresponding to the test items is completed, other tests may be performed on the device under test, and the device under test may also be replaced for testing, at this time, the any station control unit sends the start instruction to the function boards to resume the disconnected channels, which is conducive to performing of subsequent tests.

In one embodiment, the parallel control unit 10 is configured to: receive a test configuration sent by the host, wherein the test configuration includes channel numbers corresponding to the test sequences, and channels to which the channel numbers belong are located between the function boards 200 and the devices under test 100; and distribute each of the test sequences in the test items and a channel number corresponding to the test sequence in the test configuration to a station control units 20 corresponding to the channel number, and each of the station control units 20 is configured to send received test sequence(s) and channel number(s) corresponding to the received test sequence(s) to function boards 200 corresponding to the channel number(s).

In the above embodiment, by sending the channel numbers together with the corresponding test sequences, the test sequences can be sent from the parallel control unit to the station control units corresponding to the corresponding devices under test and from the station control units to the corresponding function boards according to the channel numbers.

In one embodiment, the any station control unit 20 is further configured to stop sending test sequence(s) for the target device under test to the plurality of function boards 200 when the testing of the target device under test fails.

Figure 6:
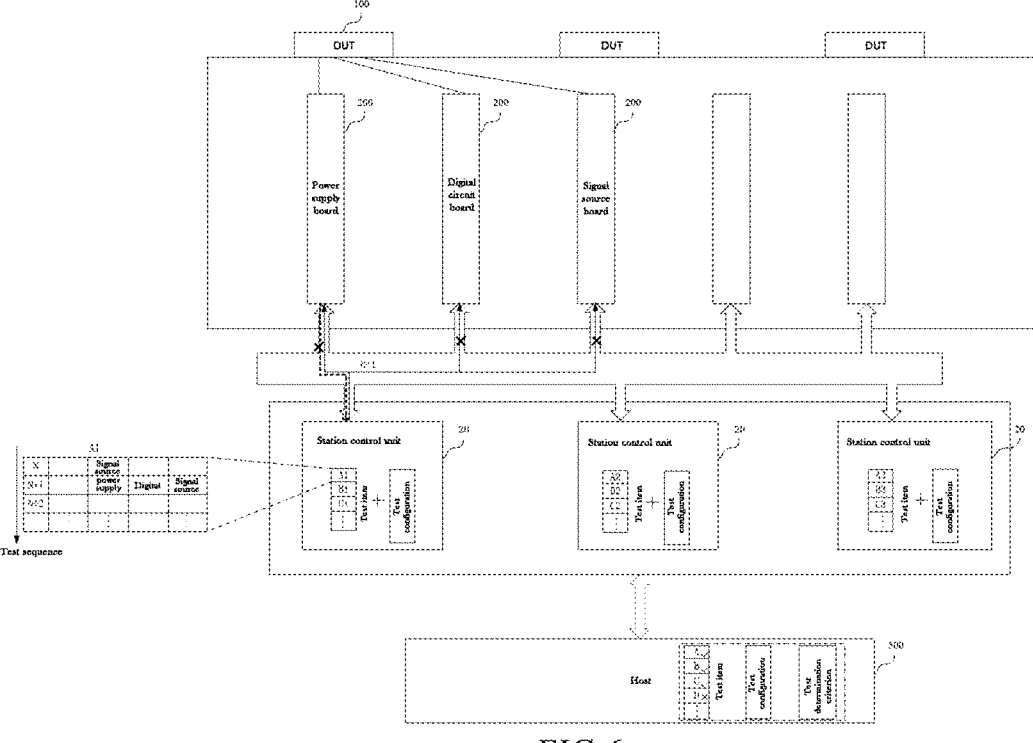
FIG. 6 is a schematic diagram illustrating the shutdown of channels of a plurality of function boards according to an embodiment.

FIG. 6 is a schematic diagram of the shutdown of channels of a plurality of function boards. As shown in FIG. 6, a plurality of test items, a test configuration, and a test determination criterion for determining whether the test is successful or failed are stored in the host. The plurality of test items include a test item A, a test item B, a test item C, a test item D, and the like, each of which includes a plurality of test sequences. The host sends the test sequences in the test items to the corresponding station control units 20, and the station control units 20 form respective test items. In a direction from left to right, the first station control unit 20 forms a test item A1, a test item B1, a test item C1, etc., the second station control unit 20 forms a test item A2, a test item B2, a test item C2, etc., and the third station control unit 20 forms a test item A3, a test item B3, a test item C3, etc.

The test item A1 includes a test sequence N, a test sequence N+1, a test sequence N+2, etc., for testing the first device under test 100 corresponding to the first station control unit 20. The testing of the first device under test 100 by the test sequence N fails, and the functions required to realize for the test sequence N+1 involve the first function board 200 (power supply board), the second function board 200 (digital circuit board), and the third function board 200 (signal source board) to test the first device under test 100. Therefore, the first station control unit 20 stops sending the test sequence N+1 to the first function board 200, the second function board 200, and the third function board 200.

In the above embodiment, by specially providing the station control units corresponding to the devices under test, the testing of the respective devices under test can be separately controlled. Therefore, when the testing of a certain device under test fails, the station control unit corresponding to this device under test can stop sending the test sequence for this device under test to the function boards, and waste of test resources can be avoided.

In one embodiment, as shown in FIG. 2, the device further comprises a packing unit 30. The packing unit 30 is connected in series between the station control units 20 and the function boards 200, and is configured to pack test sequences sent by at least two station control units 20 to the same function board 200 and channel numbers corresponding to the test sequences, and send them to the same function board 200.

Wherein the packing unit 30 is a processor. In practice, the parallel control unit 10, the station control units 20, and the packing unit 30 may be realized by using the same processor, or may be realized by using different processors.

Specifically, the plurality of station control units 20 sends test sequences and corresponding channel numbers to the packing unit 30. The packing unit 30 packs test sequences to be sent to the same function board 200 together, and sends them to the same function board 200.

In the above embodiment, the test sequences sent by the different station control units to the same function board are packed together and sent to the same function board, which is conducive to improving the efficiency of data transmission.

In one embodiment, as shown in FIG. 3, the device further includes a synchronizing unit 40, which is respectively connected to the packing unit 30, the parallel control unit 10, and the plurality of station control units 20, and is configured to obtain a synchronization signal from the parallel control unit 10 and send the synchronization signal to the plurality of station control units 20 and the packing unit 30.

Wherein the synchronizing unit 40 is a processor. In practice, the parallel control unit 10, the station control units 20, the packing unit 30 and the synchronizing unit 40 may be realized by using the same processor, or may be realized by using different processors.

Specifically, the host sends the test items and the test configuration to the parallel control unit 10, and the parallel control unit 10 may determine sending order of test sequences in the test items, and send a synchronization signal indicating that the test sequences are sent at the same time to the station control units 20 and the packing unit 30. The station control units 20 and the packing unit 30 send together the test sequences that should be sent at the same time based on the synchronization signal.

In the above embodiment, by additionally providing the synchronization module in the main control module, the sending order of the test sequences can be maintained.

Based on the same inventive concept, a tester is also provided, and as shown in FIG. 2, the tester includes the test control device 400 provided in any of the embodiments described above and a plurality of function boards 200.

Wherein, the function boards 200 are circuit boards for testing. In practice, the plurality of function boards 200 may be integrated, that is, circuits of the plurality of function boards 200 that realize different functions are arranged on the same board body. The plurality of function boards 200 may also be independent of each other, that is, the circuits of the plurality of function boards 200 that realize different functions are arranged on different board bodies, for example, a circuit that realizes one function is arranged on one board body to form one circuit board, and a circuit that realizes another function is arranged on another board body to form another circuit board.

In one embodiment, as shown in FIG. 2, each of the function boards 200 includes a controller 210 and a functional circuit 220. The controller 210 is configured to: receive a shutdown instruction carrying a target number, wherein the target number is a number of a channel between a target device under test and the function board; and control the functional circuit 220 to stop sending the excitation signal to the channel corresponding to the target number.

Wherein, the controller 210 realizes information interaction between the function board 200 and the outside (including information interaction between the function board 200 and other function boards 200), and the functional circuit 220 realizes a function of the function board 200. In practice, the controller 210 may include a processor and a communication interface.

Specifically, the test control device 400 sends the test sequences to the controller 210 together with the channel numbers. The controller 210 controls the functional circuit 220 to generate corresponding excitation signal according to the test sequences and sends the excitation signal to the devices under test 100 corresponding to the channel numbers.

In the above embodiment, the controller is arranged in the main control module, and information interaction between the function boards and the outside can thus be achieved.

Based on the same inventive concept, a test control method is also provided, which is applied to the test control device provided by any one of the above embodiments. As shown in FIG. 7, the method includes the following steps.

In a step S701, the parallel control unit receives the test items sent by the host, and sends each of test sequences in the test items to a station control unit corresponding to a device under test corresponding to the test sequence.

In a step S702, any station control unit of the station control units sends received test sequence(s) to corresponding function boards according to functions required to realize for the received test sequence(s), so as to test device(s) under test corresponding to the received test sequence(s).

In a step S703, when the testing of a target device under test fails, the any station control unit controls the plurality of function boards to stop testing the target device under test, wherein the target device under test is a device under test corresponding to the any station control unit.

In the disclosure herein, terms such as "some embodiments," "other embodiments," "preferred embodiments," or the like, are intended to be described that a particular feature, structure, material, or characteristic described in connection with the embodiment or example is included in at least one embodiment or example of the disclosure. In the disclosure, schematic depictions of the above terms do not necessarily refer to the same embodiment or example.

The technical features of the above embodiments may be combined at random. All possible combinations of the technical features of the above embodiments may not be described for the sake of brevity, but should be considered as within the scope of the present disclosure as long as there is no contradiction between the combinations of the technical features.

The above-mentioned embodiments are merely schematic several embodiments of the present disclosure. The description of the embodiments is specific and detailed, but it should not be understood as limitation on the scope of the disclosure. It should be noted that various changes and modifications can be made by those skilled in the art without departing from the spirit of the disclosure, and these changes and modifications are all within the scope of the disclosure. Therefore, the protection scope of the present patent should be subject to the appended claims.

The invention claimed is:

1. A test control device comprising a parallel control unit, a plurality of station control units and a packing unit, wherein each of the station control units corresponds to at least one device under test;

the parallel control unit is connected with the station control units and a host respectively and is configured to receive test items sent by the host and send each of test sequences in the test items to a station control unit corresponding to a device under test corresponding to the test sequence;

each of the station control units is connected with a plurality of function boards, wherein functions realized by the function boards are different, and any station control unit of the station control units is configured to send, according to the functions required to realize for received test sequence(s), the received test sequence(s) to corresponding function boards so as to test device(s) under test corresponding to the test received sequence(s), and control the plurality of function boards to stop testing a target device under test when the testing of the target device under test fails, wherein the target device under test is a device under test corresponding to the any station control unit; and the packing unit is connected between the station control units and the function boards in series and configured to pack test sequences sent by at least two station control units to the same function board and channel numbers corresponding to the test sequences, and send them to function boards corresponding to the channel numbers, wherein channels to which the channel numbers belong are located between the function boards and the devices under test.

2. The device of claim 1, wherein the any station control unit is configured to, receive test failure information of the target device under test;

determine a target number according to the test failure information, wherein the target number is a number of channels between the target device under test and the function boards; and send a shutdown instruction carrying the target number to at least one of the function boards to control the at least one function board to disconnect the channels corresponding to the target number.

3. The device of claim 2, wherein the test failure information is test data obtained by the function boards performing a test on the target device under test, or a test result obtained by a co-processing module processing the test data.

4. The device of claim 2, wherein the any station control unit is configured to send the shutdown instruction to each of the function boards, or send the shutdown instruction to a target function board, so that the target function board forwards the shutdown instruction to other function boards, wherein the target function board is any one of the plurality of function boards.

5. The device of claim 2, wherein the any station control unit is further configured to send a start instruction to each of the function boards after the testing corresponding to the test items is completed, so as to control the function boards to resume the channels corresponding to the target number.

6. The device of claim 1, wherein the parallel control unit is configured to: receive a test configuration sent by the host, wherein the test configuration includes channel numbers corresponding to the test sequences; and distribute each of the test sequences in the test items and a channel number corresponding to the test sequence in the test configuration to a station control unit corresponding to the channel number.

7. The device of claim 1, further comprising:

a synchronizing unit connected with the packing unit, the parallel control unit and the station control units respectively, and configured to acquire a synchronizing signal from the parallel control unit and send the synchronizing signal to the station control units and the packing unit.

8. The device of claim 1, wherein the any station control unit is further configured to stop sending test sequence(s) for the target device under test to the plurality of function boards when the testing of the target device under test fails.

9. A test machine comprising the test control device of claim 1 and a plurality of function boards.

10. The test machine of claim 9, wherein each of the function boards comprises a controller and a functional circuit;

wherein the controller is configured to receive a shutdown instruction carrying a target number, wherein the target number is a number of a channel between the target device under test and the function board; and control the functional circuit to stop sending excitation signal to the channel corresponding to the target number.

11. A test control method for applying to the test control device of claim 1, comprising:

receiving, by the parallel control unit, test items sent by the host, and sending each of test sequences in the test items to a station control unit corresponding to a device under test corresponding to the test sequence;

sending, by any station control unit of the station control units, according to functions required to realize for the received test sequence(s), test sequences sent by at least two station control units to the same function board and channel numbers corresponding to the test sequences packed by a packing unit connected between the plurality of station control units and the function boards in series, to function boards corresponding to the channel numbers, so as to test device(s) under test corresponding to the received test sequence(s), channels to which the channel numbers belongs are located between the function boards and the device(s) under test; and controlling, by the any station control unit, the plurality of function boards to stop testing a target device under test when the testing of the target device under test fails, wherein the target device under test is a device under test corresponding to the any station control unit.

* * * * *